United States Patent
Lin et al.

(10) Patent No.: US 9,071,255 B2
(45) Date of Patent: Jun. 30, 2015

(54) PHASE LOCKED LOOP AND ASSOCIATED PHASE ALIGNMENT METHOD

(75) Inventors: Cheng-Chieh Lin, Hsinchu County (TW); Jian-Yu Ding, Hsinchu County (TW); Yao-Chi Wang, Hsinchu (TW)

(73) Assignee: MSTAR SEMICONDUCTOR, INC., Hsinchu County (TW)

( * ) Notice: Subject to any disclaimer, the term of this patent is extended or adjusted under 35 U.S.C. 154(b) by 322 days.

(21) Appl. No.: 13/609,749

(22) Filed: Sep. 11, 2012

(65) Prior Publication Data

US 2013/0070881 A1    Mar. 21, 2013

(30) Foreign Application Priority Data

Sep. 20, 2011   (TW) .............................. 100133816 A

(51) Int. Cl.
*H03L 7/197* (2006.01)
*H03L 7/099* (2006.01)
*H03L 7/10* (2006.01)

(52) U.S. Cl.
CPC .............. *H03L 7/1976* (2013.01); *H03L 7/099* (2013.01); *H03L 7/104* (2013.01); *H03L 2207/06* (2013.01)

(58) Field of Classification Search
CPC ............. H03L 7/085; H03L 7/06; H03L 7/18; H03L 2207/14; H03L 7/193; H03L 7/1976
USPC .................................................. 375/371–376
See application file for complete search history.

(56) References Cited

U.S. PATENT DOCUMENTS

| | | | |
|---|---|---|---|
| 6,545,547 B2 | 4/2003 | Fridi et al. | |
| 8,008,956 B1 | 8/2011 | Shin et al. | |
| 2008/0048791 A1* | 2/2008 | Fahim | 331/1 A |
| 2009/0015338 A1* | 1/2009 | Frey | 331/16 |
| 2010/0259333 A1* | 10/2010 | Fu et al. | 331/46 |
| 2010/0264993 A1 | 10/2010 | Wang et al. | |
| 2011/0140790 A1* | 6/2011 | Wu et al. | 331/25 |

OTHER PUBLICATIONS

Lai et al., "A 10-GHz CMOS PLL with nan Agile VCO Calibration," Asian Solid-State Circuits Conference, 2005, vol. No., pp. 213, 216, Nov. 2005.
Taiwan Intellectual Property Office, "Office Action", Aug. 19, 2014.

* cited by examiner

*Primary Examiner* — Curtis Odom
(74) *Attorney, Agent, or Firm* — WPAT, PC; Justin King

(57) ABSTRACT

A phase locked loop and an associated alignment method are provided. A disclosed phase locked loop receives a reference signal to provide a feedback signal. The phase locked loop is first opened. When the phase locked loop is open, a frequency range of an oscillating signal from a voltage-controlled oscillator is substantially selected. The feedback signal is provided according to the oscillation signal. After the frequency range is selected, the phase locked loop is kept open and the phases of the reference signal and the feedback signal are substantially aligned. The phase locked loop is then closed after the reference signal and the feedback signal are aligned.

6 Claims, 9 Drawing Sheets

PHASE LOCKED LOOP AND ASSOCIATED PHASE ALIGNMENT METHOD

This application claims the benefit of Taiwan application Serial No. 100133816, filed Sep. 20, 2011, the subject matter of which is incorporated herein by reference.

BACKGROUND OF THE INVENTION

1. Field of the Invention

The invention relates in general to a control method for a phase locked loop and an associated apparatus, and more particularly to a control method for quickly locking a phase locked loop and an associated apparatus.

2. Description of the Related Art

A phase locked loop that can serve as a clock multiplier or a clock generator. For example, an input clock having a frequency of 10 MHz, can generate an output clock having a frequency of 1 GHz via a phase locked loop, with a predetermine alignment relationship existing between phases of the output clock and the input clock.

FIG. 1 shows a conventional phase locked loop 10 comprising a frequency/phase detector 12, a charge pump 14, a loop filter 16, a voltage-controlled oscillator (VCO) 20, a multi-modulus divisor (MMD) 22, a sigma-delta modulator (SDM) 24, and a bank correction controller 26. Via a step-up signal UP and a step-down signal DN, the frequency/phase detector 12 sends a relationship associated with frequencies and phases of a reference signal $F_{REF}$ and a feedback signal $F_{DIV}$. The charge pump 14 then provides a charging/discharging current according to the relationship. The loop filter 16 substantially collects results of the charging/discharging, and generates a control signal $V_{CTRL}$ to control a high-frequency oscillation signal $F_{VCO}$ outputted by the VCO 20. The MMD 22 steps down the oscillation signal $F_{VCO}$ to generate the feedback signal $F_{DIV}$. The SDM 24 generates a current divisor signal $P_{IN}$ according to a desired divisor consisted of an integral signal $N_{INT}$ and a fraction signal $N_{FRAC}$ to determine a frequency divisor $N_{DIV}$ to be executed by the MMD 22. With a signal loop provided by the frequency/phase divisor 12, the charge pump 14, the loop filter 16, the VCO 20, and the MMD 22, the phase of the feedback signal $F_{DIV}$ is enabled to substantially follow the phase of the reference signal $F_{REF}$.

To reduce noise generated by the phase locked loop, a voltage-to-frequency gain of the VCO 20 during operations is designed to be low. To improve a narrow lockable range resulted by the low gain, the VCO 20 is designed with several banks each providing a corresponding lockable range. FIG. 2 shows an operation time sequence of the phase locked loop 10. The bank correction controller initially fixes a voltage of the control signal $V_{CTRL}$ at a voltage value $V_{REF}$ to equivalently open the phase locked loop 10, and then performs correction bank by bank in a bank correction 27. During the bank correction 27, the bank correction controller 26 checks a relationship between the oscillation signal $F_{VCO}$ and the reference signal $F_{REF}$, and selects a bank on which the VCO 20 operates according to a selection signal BS.

After the banks for the VCO 20 are confirmed, the frequencies of the reference signal $F_{REF}$ and the feedback signal $F_{DIV}$ approximating each other, and a close loop locking 29 performed. The bank correction controller 26 disengages the control signal $V_{CTRL}$ from the clamping of the voltage value $V_{REF}$, such that the phase locked loop 10 becomes closed to allow the phase of the feedback signal $F_{DIV}$ to follow the phase of the reference signal $F_{REF}$ having an approximate frequency. A period from the phase locked loop being closed to being locked is defined as a lock time.

FIG. 3 shows a conventional frequency/phase detector 12. Although the frequencies of the reference signal $F_{REF}$ and the feedback signal $F_{DIV}$ already fall within approximate ranges after the banks within are confirmed, the phases of the reference signal $F_{REF}$ and the feedback signal $F_{DIV}$ may yet be quite different, with a maximum difference possibly being as large as 360 degrees. FIG. 4 shows a possible signal timing diagram, in which from top to bottom are the reference signal $F_{REF}$, the feedback signal $F_{DIV}$, the step-up signal UP, and the step-down signal DN. In FIG. 4, the phase of the feedback signal $F_{DIV}$ falls behind that of the reference signal $F_{REF}$ by almost 360 degrees. Therefore, in a references cycle of the reference signal $F_{REF}$, the step-up signal UP is at logic 1 most of the time.

When a phase difference gets large, the large phase difference is inclined to cause an increased lock time despite that the frequencies of the reference signal $F_{REF}$ and the feedback signal $F_{DIV}$ approximate each other, such that the increased lock time may exceed a lock time limit demanded by a system. FIG. 5 shows a corresponding control signal $V_{CTRL}$ possibly generated in response to the signals in FIG. 4. Since the step-up signal UP is mostly at logic 1, the control signal $V_{CTRL}$ quickly reaches a non-linear, saturated high point once the phase locked loop becomes closed and locked. At this point, the frequency of the feedback signal $F_{DIV}$ is slightly higher than that of the reference signal $F_{REF}$, and so a rising edge of the feedback signal $F_{DIV}$ gradually approximates a rising edge of the reference signal $F_{REF}$ until a delayed part in the phase is made up—such process is referred to as non-linear settling. The control signal $V_{CTRL}$ then returns to linearity so that the frequency of the feedback signal $F_{DIV}$ approximates that of the reference signal $F_{REF}$—such a process is referred to as linear settling. In short, a locking time $T_{LOCK}$ is a total time of a time $T_{NON\text{-}LINEAR}$ required for non-linear settling and a time $T_{LINEAR}$ required for linear settling. $T_{NON\text{-}LINEAR}$ may be roughly calculated by an equation (1) below.

$$T_{NON\text{-}LINEAR} = (1/(f_{REF} * f_{DIV}))/(1/f_{DIV} - 1/f_{REF}) \quad (1)$$
$$= 1/(f_{DIV} - f_{REF})$$
$$= N_{DIV}/\Delta f_{VCO}$$

In the equation (1), $f_{REF}$ and $f_{DIV}$ are respectively frequencies of the reference signal $F_{REF}$ and the feedback signal $F_{DIV}$, $N_{DIV}$ is a divisor when the MMD 22 performs close loop locking, and $\Delta f_{VCO}$ is a possible maximum frequency difference of the VCO 20 for a current bank. For example, when $\Delta f_{VCO}$ is around 3.978 GHz, $F_{REF}$ is around 26 MHz and $\Delta f_{VCO}$ is around 1 MHz, $T_{NON\text{-}LINEAR}$ equals (3978/26)/1, which is as high as 153 μs. The rather long period of the $T_{NON\text{-}LINEAR}$ is likely to exceed a predetermined tolerance of a system that has a set limit for the lock time, in a way that the system may fail to meet standardized specifications. For example, for communication systems including Global System for Mobile Communications (GSM), Bluetooth, Wireless Fidelity (WiFi) implementing burst transmission that switches among channels, a limit of the lock time $T_{LOCK}$ is defined, which means the above excessive $T_{NON\text{-}LINEAR}$ required for non-linear settling is unacceptable.

SUMMARY OF THE INVENTION

According to an aspect the present invention, a phase alignment method is provided. The method comprises: rendering a phase locked loop, the phase locked loop receiving a reference signal and providing a feedback signal; opening the phase locked loop; comparing phases of the reference signal and the feedback signal when the phase locked loop is open to generate a phase difference signal; and changing a frequency or the phase of either the reference signal or the feedback signal to allow the phase of the feedback signal to approximate that of the reference signal. After the frequency or the phase of the reference signal or the feedback signal is changed, the phase locked loop is closed to allow the frequency or the phase of the feedback signal to follow that of the reference signal.

According to another aspect the present invention, a phase locked loop comprising an oscillator, a frequency divisor, a phase detector, and a phase controller is provided. The oscillator provides an oscillation signal. The frequency divisor generates a feedback signal according to the oscillation signal and a divisor control signal. The phase detector compares a reference signal with the feedback signal to generate a phase difference signal. The phase controller renders the oscillation signal to be independent from the phase difference signal, and modifies the divisor control signal according to the phase difference signal when the oscillation signal is independent from the phase difference signal. After at least one feedback period of the feedback signal subsequent to the phase controller modifies the divisor controller signal, the phase controller starts to associate the phase difference signal with the oscillation signal and restores the divisor control signal.

According to another aspect the present invention, a phase locked loop comprising an oscillator, a frequency divisor, a phase detector, a phase selector, and a phase controller is provided. The oscillator provides an oscillation signal. The frequency divider generates a feedback signal according to the oscillation signal and a divisor control signal. The phase detector compares a reference signal with the feedback signal to generate a phase difference signal. The phase selector selects a phase of a pre-reference signal as the reference signal according to a phase selection signal. The phase controller renders the oscillation signal to be independent from the phase difference signal, and determines the phase selection signal according to the phase difference signal. The phase controller further renders the oscillation signal to be non-independent from the phase difference signal after determining the phase selection signal.

According to another aspect the present invention, a control method for a phase locked loop is provided. The phase locked loop receives a reference signal and provides a feedback signal. The control method comprises: opening the phase locked loop; substantially selecting a frequency range of an oscillation signal outputted by an oscillator when the phase locked loop is open, with the feedback signal being generated according to the oscillation signal; keeping the phase locked loop open after the frequency range is selected, and substantially aligning phases of the reference signal and the feedback signal; and closing the phase locked loop when the phases of the reference signal and the feedback signal are substantially aligned.

The above and other aspects of the invention will become better understood with regard to the following detailed description of the preferred but non-limiting embodiments. The following description is made with reference to the accompanying drawings.

DETAILED DESCRIPTION OF THE INVENTION

Figure 2:
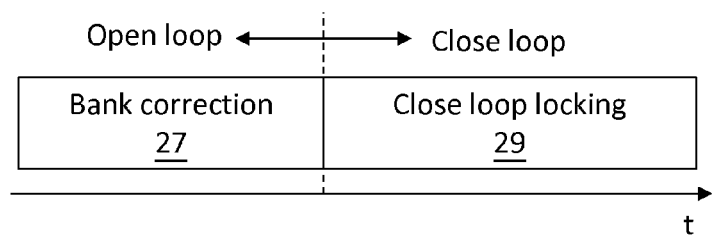
FIG. 2 is an operation time sequence of the phase locked loop in FIG. 1.
Figure 3:
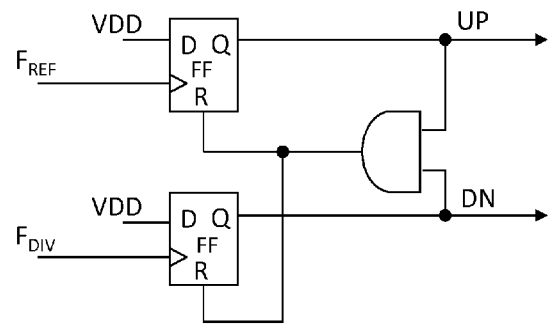
FIG. 3 is a conventional phase/frequency detector.
Figure 4:
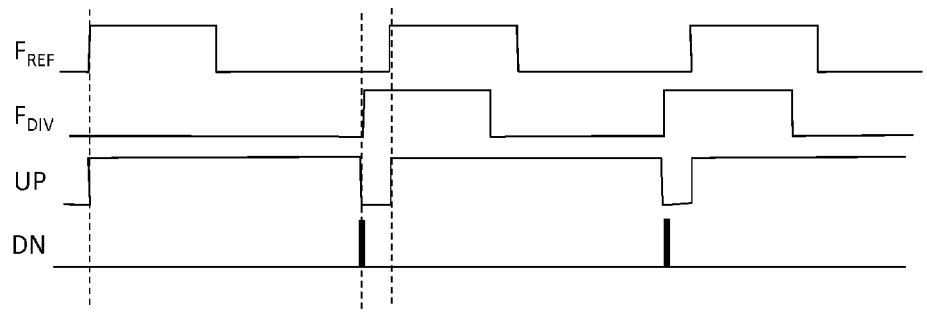
FIG. 4 is a timing diagram of signals in FIG. 1.
Figure 5:
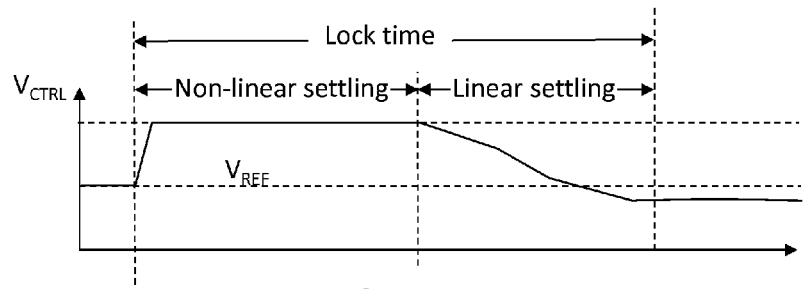
FIG. 5 is a possible control signal $V_{CTRL}$ resulted from the signal timings in FIG. 4.
Figure 6:
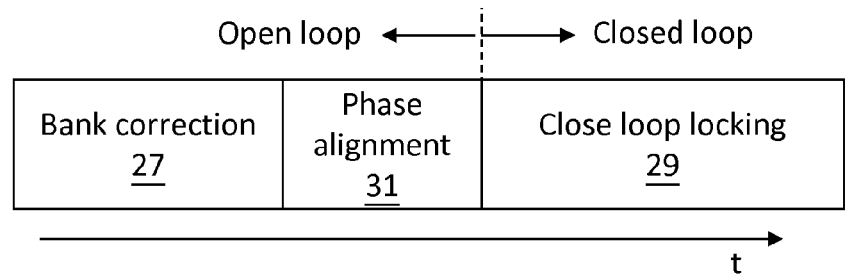
FIG. 6 is an operation time sequence of a phase locked loop according to an embodiment of the present invention.

FIG. 6 shows an operation time sequence of a phase locked loop according to an embodiment of the present invention. Comparing FIGS. 2 and 6, at least one process of phase alignment 31 is added between the bank correction and the close loop locking in FIG. 6, and is performed when the phase locked loop is open.

Referring to FIG. 6, in an embodiment of the present invention, a phase locked loop is opened, and a bank correction 27 is then performed to determine a bank of a VCO in the phase locked loop, which is in equivalence selecting a frequency range of an oscillation signal outputted by the VCO. Within a period, the phase alignment 31 is performed. In this embodiment, an approach for the phase alignment selects a frequency or a phase of a reference signal or a feedback signal when the phase locked loop is kept open, and then closes the phase clocked loop and locks the close loop when the phase of the reference signal or the reference signal is aligned to within a difference range after a period of time. Since the phase is aligned to within the difference range, a phase locking is quickly achieved during close loop locking 29. In other words, a lock time is significantly reduced accordingly.

Figure 7:
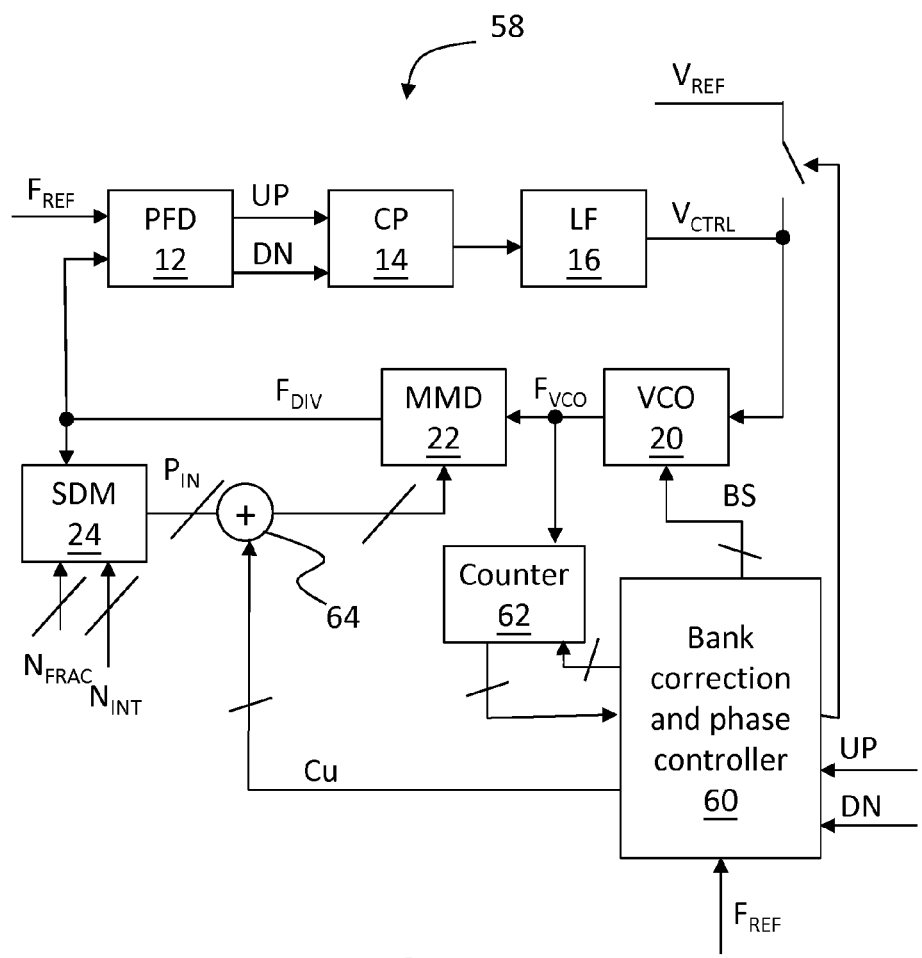
FIG. 7 is a phase locked loop according to an embodiment of the present invention.

FIG. 7 shows a phase locked loop 58 according to an embodiment of the present invention. The phase locked loop 58 comprises a frequency/phase detector 12, a charge pump 14, a loop filter 16, a VCO 20, an MMD 22, an SDM 24, an adder 64, a counter 62, and a bank correction and phase controller 60. Identical components shown in FIG. 7 and FIG. 1 can be easily appreciated by a person skilled in the art, and shall not be further described for the sake of brevity.

When performing the bank correction 27 and the phase alignment 31, the bank correction and phase controller 60 clamps a control signal $V_{CTRL}$ to a fixed voltage value $V_{REF}$, i.e., the phase locked loop 58 is opened.

During the bank correction, the counter 62 provides a frequency ratio within a difference between a current reference signal $F_{REF}$ and an oscillation signal $F_{VCO}$. The bank correction and phase controller 60 accordingly adjusts a selection signal BS until the frequency ratio reaches a predetermined value to complete the bank correction. The predetermined value is a current frequency divisor $N_{DIV}$ to be executed by the MMD 22. Taking a highest channel of an RX mode of the mobile phone PCS1900 for example, a reference frequency $f_{REF}$ of the reference signal $F_{REF}$ is around 26 MHz, and an oscillation frequency $f_{VCO}$ of the oscillation signal $F_{VCO}$ up to 9.978 GHz is desired. Therefore, the bank correction and phase controller 60 adjusts the selection signal BS to select the bank of the VCO 20, until the counter 62 obtains through calculation that there are 3978/26(=153) oscillation periods of the oscillation signal $F_{VCO}$ in each reference period of the reference signal $F_{REF}$. In this embodiment, the oscillation signal $F_{REF}$ serves as a clock for the counter 62 until a count of 153 within reference period is obtained. At this point, a divisor signal $P_{IN}$ triggers the MMD 22 to perform the frequency dividing by the divisor $N_{DIV}$ of 153, and so a feedback frequency $f_{DIV}$ of a feedback signal $F_{DIV}$ approximately equals the reference frequency $f_{REF}$ of the reference signal $F_{REF}$ to both be around 26 MHz.

Since the control signal $V_{CTRL}$ is clamped by the voltage value $V_{REF}$, the phase locked loop 10 becomes closed, and the oscillation signal $F_{VCO}$ is independent from a step-up signal UP and a step-down signal DN.

After the bank correction 27 is completed, the bank correction and phase controller 60 performs the phase alignment 31.

Figure 8:
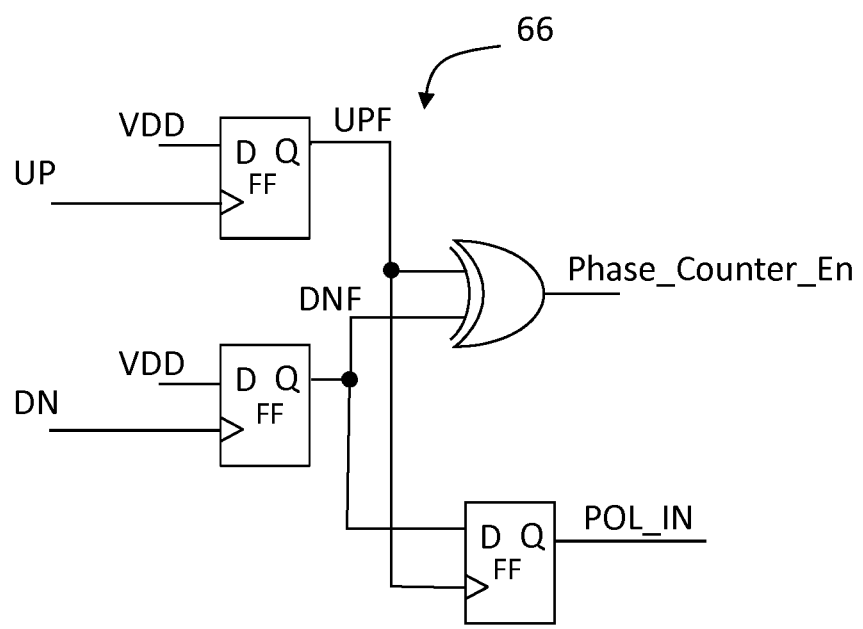
FIG. 8 is an apparatus 66 implemented in a bank and correction controller in FIG. 7.

The step-up signal UP and a step-down signal DN generated by the frequency/phase detector 12 provide a message of phase difference between the reference signal $F_{REF}$ and the feedback signal $F_{DIV}$, and may then be regarded as a phase difference signal. FIG. 8 shows an apparatus 66 implemented in the bank correction and phase controller 60. The apparatus 66 is for generating a phase counter enables signal Phase_Counter_En and a polarity signal POL_IN according to the step-up signal UP and the step-down signal DN. In short, rising edges of a step-up recording signal UPF and a step-down recording signal DNF respectively record appearing time points of a rising edge of the step-up signal UP and a rising edge of the step-down signal DN. When the phase counter enable signal Phase_Counter_En is at logic 1, it means the rising edge appears in either one of the step-up signal UP and the step-down signal DN while the rising edge of the other signal is not yet appeared. Therefore, a pulse width of the phase counter enable signal Phase_Counter_En at logic 1 represents a time difference between the rising edge of the step-up signal UP and the rising edge of the step-down signal DN. When the polarity signal POL_IN is at logic 1, it means the rising edge of the step-up signal UP appears ahead of the rising edge of the step-down signal DN. Vice versa, when the polarity signal POL_IN is at logic 0, it means the rising edge of the step-up signal UP appears behind the rising edge of the step-down signal DN.

Figure 9:
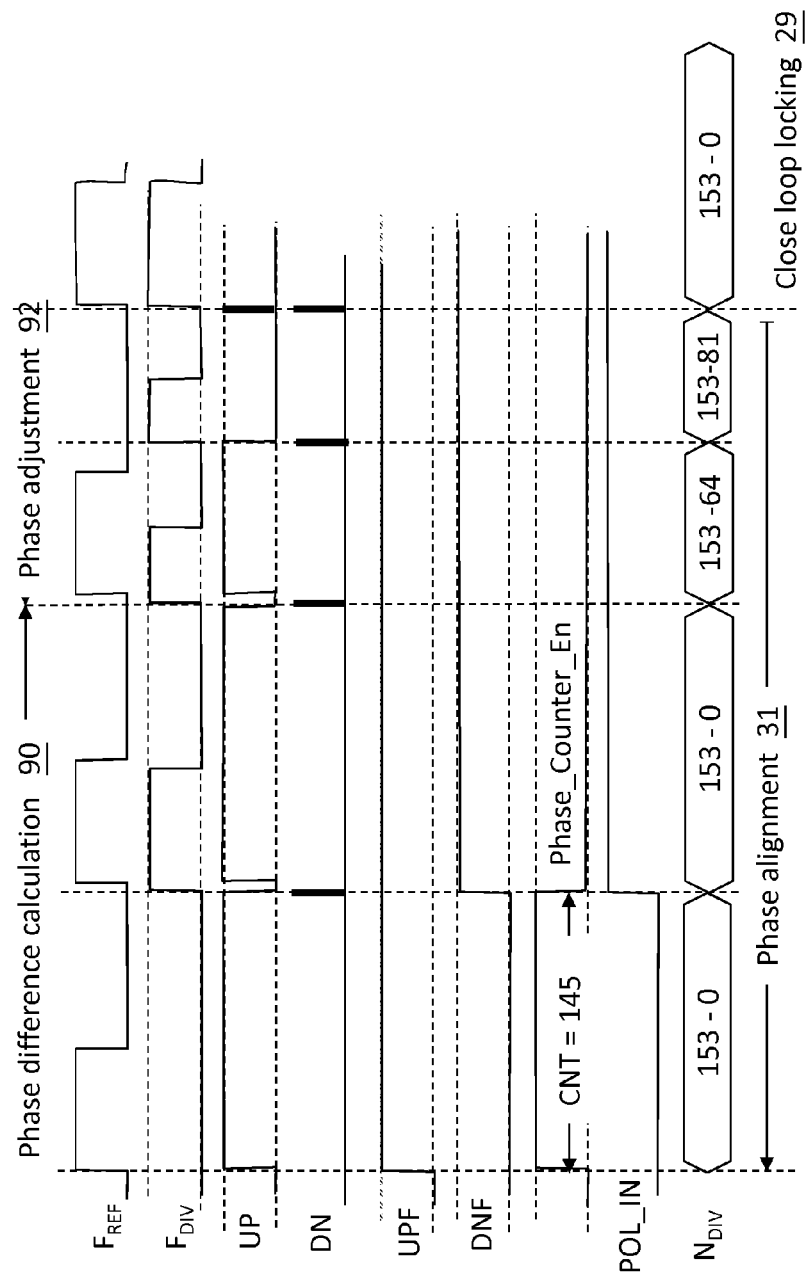
FIG. 9 is a timing diagram of signals in FIG. 7 and FIG. 8.

FIG. 9 showing a timing diagram of signals in FIGS. 7 and 8 depicts, from top to bottom, the reference signal $F_{REF}$, the feedback signal $F_{DIV}$, the step-up signal UP, the step-down signal DN, the step-up recording signal UPF, the step-down recording signal DNF, the phase counter enable signal Phase_Counter_En, the polarity signal POL_IN, and the divisor $N_{DIV}$ executed by the MMD 22. In the embodiment of FIG. 9, after the bank correction is completed, the reference frequency $f_{REF}$ and the feedback frequency $f_{DIV}$ approximate 26 MHz, the oscillation frequency $f_{VCO}$ is 3.978 GHz, the divisor is 153, and the phase of the feedback signal $F_{DIV}$ however falls behind that of the reference signal $F_{REF}$ by around 360 degrees.

As shown in FIG. 9, the period of the phase alignment is divided into two time processes—a phase difference calculation 90 and a phase adjustment 92.

The phase difference calculation 90, being about two feedback periods of the feedback signal $F_{DIV}$ in duration, is utilized for obtaining a time of the phase difference between and polarities of the reference signal $F_{REF}$ and the feedback signal $F_{DIV}$. The oscillation signal $F_{VCO}$ serves as the clock for the counter 62 at this point. The counter 62 counts along with the oscillation signal $F_{VCO}$ when the phase counter enable signal Phase_Counter_En is at logic 1, and stops counting when the phase counter enable signal Phase_Counter_En is at logic 0. In FIG. 9, when the phase difference calculation ends, the count CNT of the counter 62 is 145 and the polarity signal POL_IN is 1, which means the feedback signal $F_{DIV}$ falls behind the reference signal $F_{REF}$ by about 145 oscillation periods of the oscillation signal $F_{VCO}$. Therefore, the count CNT and the polarity signal POL_IN may be together regarded as a phase difference signal.

During the phase adjustment 92, the feedback frequency $f_{DIV}$ of the feedback signal $F_{DIV}$ is changed by modifying the divisor $N_{DIV}$, such that the rising edge of the feedback signal $F_{DIV}$ may quickly catch up with a part by which the feedback signal $F_{DIV}$ falls behind the reference signal $F_{REF}$. In FIG. 9, the phase adjustment 92 needs to advance the rising edge of the feedback signal $F_{DIV}$ by 145 oscillation periods. Supposing the rising edge of the feedback signal $F_{DIV}$ is advanced by CNT oscillation periods when the divisor $N_{DIV}$ of the MMD 22 is subtracted by X, an equation (2) below is obtained:

$$N_{DIV}/f_{VCO}-(N_{DIV}-X)/f_{VCO}=\text{CNT}/f_{VCO} \quad (2)$$

An equation (3) can be deduced:

$$X=\text{CNT} \quad (3)$$

In other words, the count CNT of the counter 62 and the polarity signal POL_IN may be utilized as basis for modifying the divisor $N_{DIV}$. During the phase adjustment period in FIG. 9, the bank correction and phase controller 60 first sets Cu to 64, such that the divisor $N_{DIV}$ is modified to 153−64=89. The bank correction and phase controller 60 then sets Cu to 81(=145−64), such that divisor $N_{DIV}$ is modified to 153−81=72. Therefore, after two feedback periods of the feedback signal $F_{DIV}$, the rising edge of the feedback signal $F_{DIV}$ is advanced by a total of 145 (=64+81) oscillation periods ahead of that of the feedback signal $F_{DIV}$ when the divisor $N_{DIV}$ is not adjusted. It can be expected that when the phase adjustment 92 ends, the rising edge of the feedback signal $F_{DIV}$ is substantially aligned with the rising edge of the reference signal $F_{REF}$ to achieve the object of phase alignment, as shown in FIG. 9. In other embodiments, the polarity signal POL_IN may be 0 and so the divisor $N_{DIV}$ is increased according to the count of the counter 62 during the phase adjustment, so as to delay the time point at which the rising edge of the feedback signal $F_{DIV}$ appears.

In the embodiment of FIG. 9, the phase adjustment is completed by using around two feedback periods. In other embodiments, due to possible modifiable range limits of the divisor $N_{DIV}$ of the MMD 22, more or less feedback periods may be needed to complete the phase adjustment. For example, in another embodiment, the phase adjustment is completed by using 10 feedback periods, with the divisor $N_{DIV}$ adopted by the feedback periods respectively being (153−16, . . . , 153−10, 153−9).

The close loop locking 29 is performed after completing the phase adjustment 92. The bank correction and phase controller 60 disengages the control signal VCTRL from the clamping of the voltage value VREF such that the phase locked loop 58 becomes a closed loop. The bank correction and phase controller 60 sets Cu to 0 so that the divisor $N_{DIV}$ restores to the original value of 153. Since the phase locked loop 58 is closed at this point, the oscillation signal $F_{VCO}$ begins to associate with the step-up signal UP and the step-down signal DN, and the phase of the feedback signal $F_{DIV}$ starts to follow the phase of the reference signal $F_{REF}$. The rising edge of the feedback signal $F_{DIV}$ is already substantially aligned with the rising edge of the reference signal $F_{REF}$ at the beginning of the close loop locking 29, and therefore the time $T_{NON-LINEAR}$ required by non-linear settling is very much close to 0. It can be expected that the lock time is close to the time $T_{LINEAR}$ required by linear settling to be extremely short.

With reference to FIG. 9, the phase difference calculation 90 is two feedback periods of the feedback signal $F_{DIV}$ in duration, i.e., (2*153/3978) µs. The phase adjustment is also two feedback periods in duration, i.e., [(153−64)+(153−81)]/3978 µs. As a result, the time needed for the phase alignment 31 in the embodiment shown in FIG. 9 is merely 0.117 µs, which is less than 1/100 of 153 µs as the time $T_{NON-LINEAR}$ required by non-linear settling in the prior art. Therefore, the embodiment in FIG. 9 significantly reduces the lock time.

Figure 10:
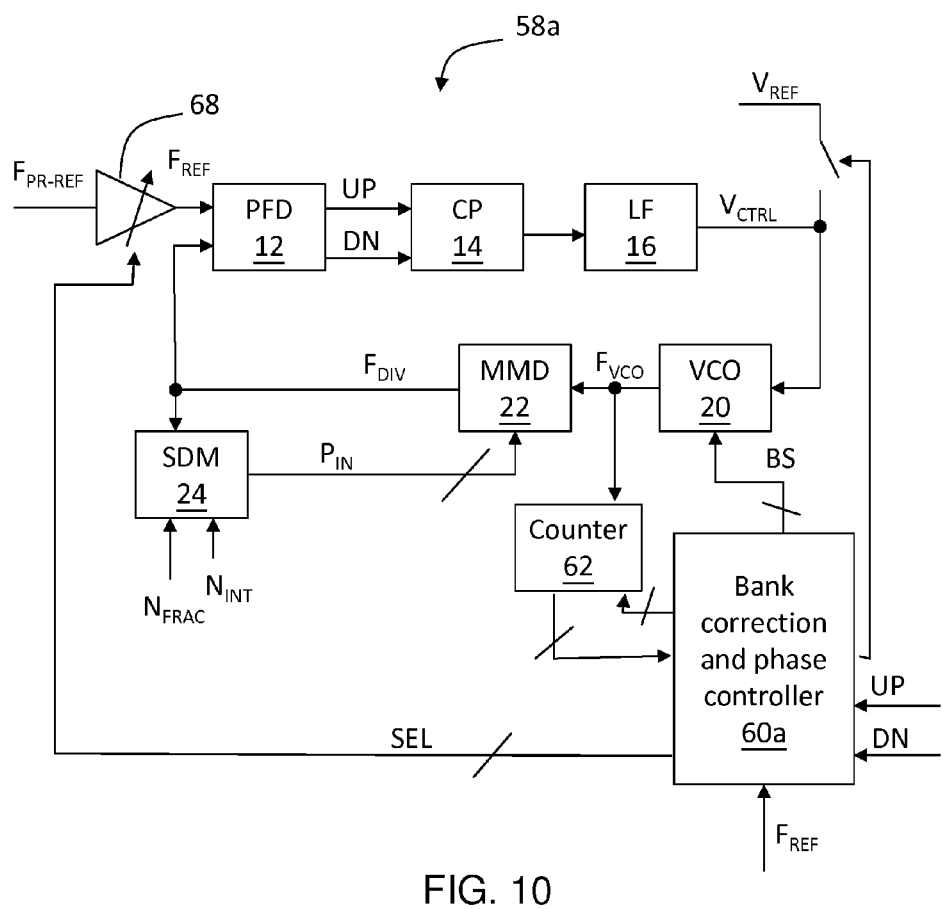
FIGS. 10 to 13 are several phase locked loops according to different embodiments of the present invention.

FIG. 10 shows a phase locked loop 58a according to another embodiment of the present invention. A difference from FIG. 7 is that, the phase locked loop 58a replaces the adder 64 by a phase selector 68. The phase selector 68 selects a phase of a pre-reference signal $F_{PR\_REF}$ as the reference signal $F_{REF}$ according to a selection signal SEL. The selection signal SEL is determined by a bank correction and phase controller 60a.

Similar to the operation time sequence shown in FIG. 6, the phase locked loop 58a first clamps the control signal $V_{CTRL}$ to a fixed voltage reference value $V_{REF}$, i.e., the bank correction 27 and the phase alignment 31 are performed when the phase locked loop 58a is open. The control signal $V_{CTRL}$ is unclamped from the voltage value $V_{REF}$ to close the phase locked loop 58a, and the close loop locking 29 is then performed. During the bank correction 27 and the close loop locking 29, the selection signal SEL is kept substantially unchanged.

During the phase alignment 31, the bank correction and phase controller 60a in the phase locked loop 58a utilize the counter 62, the step-up signal UP and the step-down signal DN to calculate the phase difference. According to the phase difference, the bank correction and phase controller 60a changes the selection signal SEL. For example, when performing the phase alignment 31, the bank correction and phase controller 60a learns that the feedback signal $F_{DIV}$ falls behind the reference signal $F_{REF}$ by about 145 oscillation periods of the oscillation signal $F_{VCO}$ and the divisor NDIV currently adopted by the MMD 22 is about 153. Thus, the bank correction and phase controller 60a changes the selection signal SEL, so that the phase selector 68 selects from the pre-reference signal $F_{PR\_REF}$ a phase currently behind by 145/153*360 degrees as the reference signal $F_{REF}$. Consequently, the phases of the reference signal $F_{REF}$ and the feedback signal $F_{DIV}$ are substantially aligned. In other words, in this embodiment, the bank correction and phase controller 60a renders the oscillation signal to be independent from the phase difference signal, and modifies the divisor control signal according to the phase difference signal when the oscillation signal is independent from the phase difference signal. After at least one feedback period of the feedback signal subsequent to the phase controller modifies the divisor controller signal, the phase controller starts to associate the phase difference signal with the oscillation signal and restores the divisor control signal.

After the phase alignment 31 is completed, the selection signal SEL is kept unchanged and the phase locked loop 58a starts the close loop locking 29. The phase of the feedback signal $F_{DIV}$ starts to follow the phase of the reference signal $F_{REF}$. The rising edge of the feedback signal $F_{DIV}$ is already substantially aligned with the rising edge of the reference signal $F_{REF}$ at the beginning of the close loop locking 29, and therefore it can be expected that the lock time is extremely short.

In both embodiments shown in FIGS. 7 and 10, the phase difference between the phase of the reference signal $F_{REF}$ and the feedback signal $F_{DIV}$ is first obtained, followed by performing the phase adjustment. The phase locked loop 58 in FIG. 7 temporarily modifies the divisor $N_{DIV}$ of the MMD 22 to also temporarily change the frequency of the feedback signal $F_{DIV}$, so as to greatly change the time point at which the rising edge of the feedback signal $F_{DIV}$ appears to substantially align the phases. On the other hand, the phase locked loop 58a in FIG. 10 permanently changes the phase of the reference signal $F_{REF}$ after obtaining the phase difference, so as to directly force the rising edge of the reference signal $F_{REF}$ to substantially align with the rising edge of the feedback signal $F_{DIV}$ to complete the phase alignment.

Figure 11:
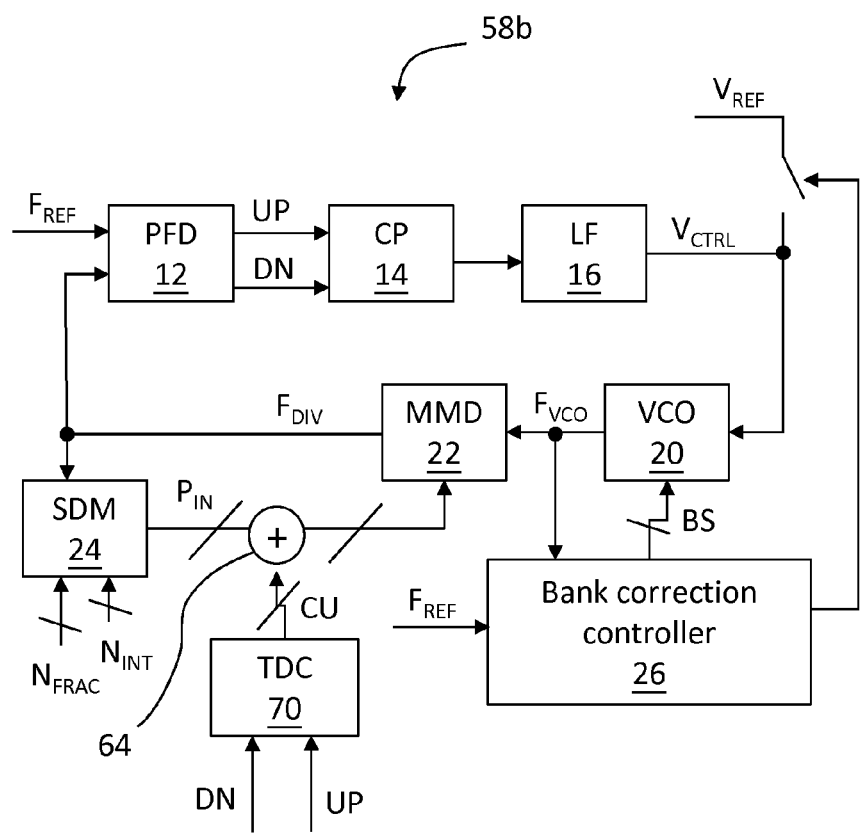

FIG. 11 shows a phase locked loop 58b according to another embodiment of the present invention. This embodiment is practiced based on the basis of the phase difference, which is substantially a type of time difference. By converting the time difference to a digital signal, the concept of the phase difference calculation may be executed by a time-to-digital converter (TDC). Further, the phase locked loop 58b replaces the phase locked loop 10 in FIG. 1 by a TDC 70 and an adder 64. Similar to the operation time sequence in FIG. 6, the phase locked loop 58b first performs the bank correction 27 and the phase alignment 31, followed by performing the close loop locking 29. During the phase alignment 31, the TDC 70 obtains the phase difference between the feedback signal $F_{DIV}$ and the reference signal $F_{REF}$ according to the step-up signal UP and the step-down signal DN, and converts the phase difference to a digital modification signal CU to momentarily modify the divisor $N_{DIV}$ of the MMD 22. During the close loop locking 29, the TDC 70 no longer affects the divisor $N_{DIV}$ and the digital modification signal CU is maintained at 0, so that the divisor $N_{DIV}$ of the MMD 22 returns to being controlled by the divisor control signal $P_{IN}$ of the SDM 24. The operation time sequence and principles of the phase locked loop 58b in FIG. 11 can be appreciated with reference to the description on the phase locked look 58 in FIG. 7, and shall not be further described.

Figure 1:
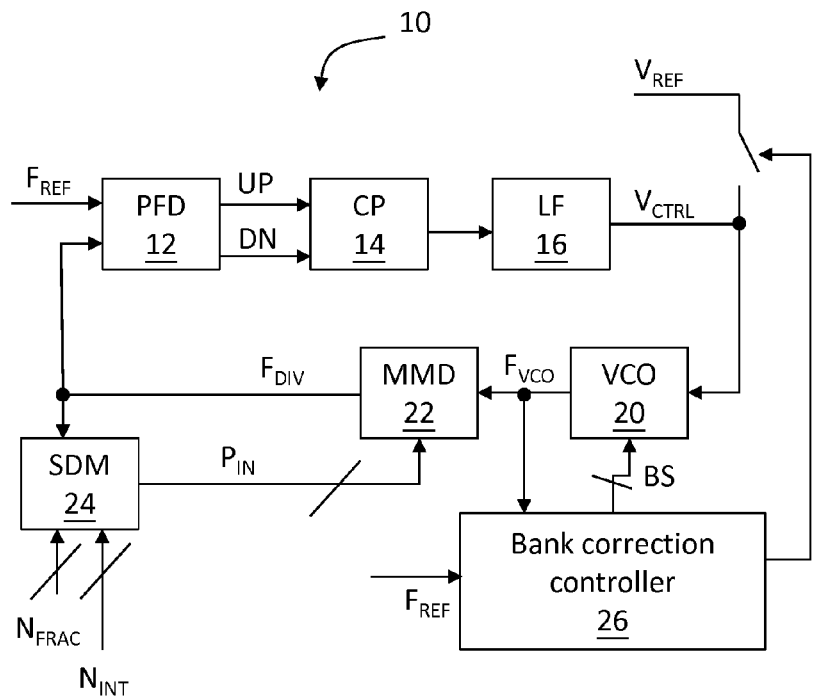
FIG. 1 is a conventional phase locked loop.
Figure 12:
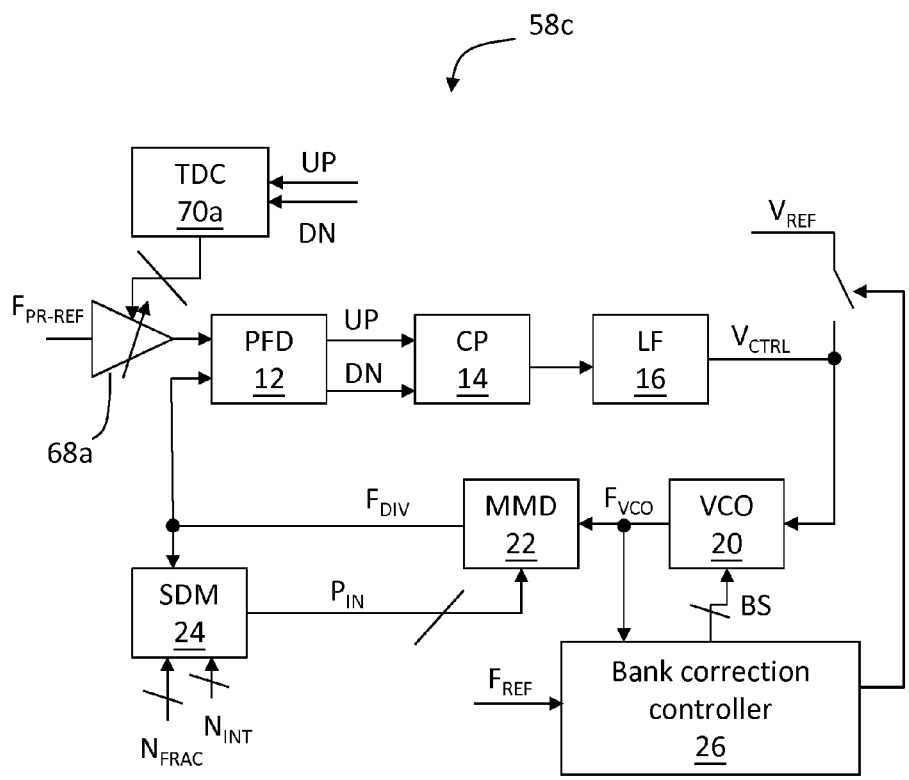

FIG. 12 shows a phase locked loop 58c according to yet another embodiment of the present invention. A difference from the phase locked loop 10 in FIG. 1 is that, the phase locked loop 58c comprises a TDC 70a and a phase selector 68a. Similar to the operation time sequence in FIG. 6, the phase locked loop 58c first performs the bank correction 27 and the phase alignment 31, followed by performing the close loop locking 29. During the phase alignment 31, the TDC 70a obtains the phase difference between the feedback signal $F_{DIV}$ and the reference signal $F_{REF}$ according to the step-up signal UP and the step-down signal DN, and converts the phase difference to a selection signal SEL to permanently change the phase of the reference signal $F_{REF}$. The operation time sequence and principles of the phase locked loop 58c in FIG. 12 can be appreciated with reference to the description on the phase locked look 58a in FIG. 10, and shall not be further described.

Figure 13:
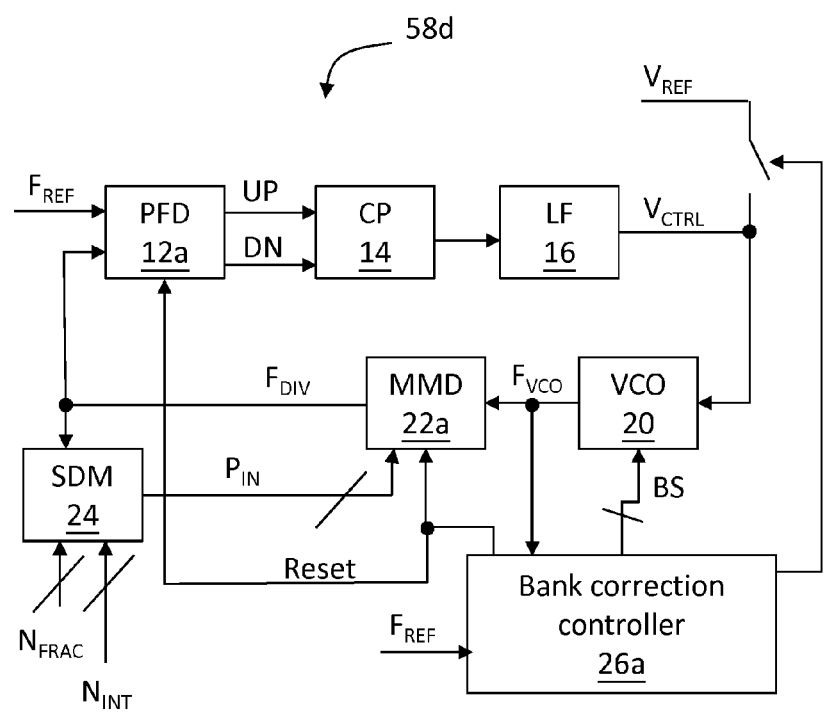

FIG. 13 shows a phase locked loop 58d according to yet another embodiment of the present invention. The phase locked loop 58d in FIG. 13 enters the close lock locking 29 after the bank of the VCO 20 is confirmed. At this point, a bank correction controller 26a sends a short pulse signal Reset at a first rising edge of the reference signal $F_{REF}$ to reset an MMD 22a and a phase/frequency detector 12a. For example, when the phase/frequency detector 12a is reset, the step-up signal UP and the step-down signal DN are forced to 0, and the feedback signal $F_{DIV}$ outputted by the MMD 22a immediately starts from a rising edge. Because the short pulse signal Reset substantially synchronizes the rising edge of the feedback signal $F_{DIV}$ with the rising edge of the reference signal $F_{REF}$, and the step-up signal UP and the step-down signal DN both start from 0, a situation that the phase difference being as large as 360 degrees is completely avoided to noticeably improve the lock time.

While the invention has been described by way of example and in terms of the preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A phase alignment method, comprising:
   rendering a phase locked loop, for receiving a reference signal to generate a feedback signal;
   opening the phase locked loop, comparing phases of the reference signal and the feedback signal to generate a phase difference signal, and changing a frequency or the phase of either the feedback signal or the reference signal to allow the phase of the feedback signal to approximate that of the reference signal; and
   closing the phase locked loop after changing the frequency or the phase of either the feedback signal or the reference signal to allow the frequency of the phase of the feedback signal to follow that of the reference signal,
   wherein the phase locked loop comprises a frequency divider for generating the feedback signal according to a divisor control signal; when the phase locked loop is opened, the feedback signal is generated according to the divisor control signal having a first divisor value in a first period, and the feedback signal is generated according to the divisor control signal having a second divisor value in a second period; when the phase locked loop is closed, the feedback signal is generated according to the divisor control signal having the first divisor value.

2. The phase alignment method according to claim 1, wherein the step of comparing the phases of the reference signal and the feedback signal to generate the phase difference signal comprises:
   changing the frequency or the phase of the feedback signal according to the phase difference signal when the phase locked loop is open to approximate the phase of the feedback signal to that of the reference signal; and
   closing the phase locked loop after changing the frequency or the phase of the feedback signal to allow the frequency of or the phase of the feedback signal to follow that of the reference signal.

3. The phase alignment method according to claim 1, the phase locked loop comprising an oscillator for providing an oscillation signal, the phase alignment method further comprising:
   counting a count according to the oscillation signal; and
   generating the second divisor value according to the count.

4. The phase alignment method according to claim 3, wherein the phase difference signal comprises a polarity signal for indicating whether the phase of the reference signal leads ahead or falls behind that of the feedback signal.

5. The phase alignment method according to claim 1, further comprising:
   providing a pre-reference signal; and
   selecting a phase of the pre-reference signal as the reference signal according to the phase difference signal.

6. The phase alignment method according to claim 2, further comprising:
   modifying the divisor control signal within a plurality of feedback periods of the feedback signal according to the phase difference signal.

\* \* \* \* \*